United States Patent [19]

Carl et al.

[11] Patent Number: 5,032,953
[45] Date of Patent: Jul. 16, 1991

[54] SURFACE MOUNTED SINGLE IN-LINE ELECTRONIC COMPONENT PACKAGE WITH MOUNTING PROJECTIONS AND CHAMFERED VIEWING EDGE

[75] Inventors: Robert L. Carl; Ka K. Wai, both of San Diego, Calif.; Jose L. V. Ortega, Tijuana, Mexico

[73] Assignee: Pulse Engineering, Inc., San Diego, Calif.

[21] Appl. No.: 567,601

[22] Filed: Aug. 15, 1990

[51] Int. Cl.$^5$ .................. H05K 5/00; H01L 23/02
[52] U.S. Cl. .................... 361/394; 361/405; 361/392; 361/395; 174/52.4; 357/74; D13/182
[58] Field of Search .............. 439/68, 70, 72, 83, 439/488, 910, 928; 361/392, 394, 395, 400, 403, 405, 412, 421; 174/52.4, 52.2; 357/74, 80; D13/147, 182

[56] References Cited

U.S. PATENT DOCUMENTS 4,080,026 3/1978 Gianni .................... 357/74 X
4,967,262 10/1990 Farnsworth ................ 361/400 X

FOREIGN PATENT DOCUMENTS 2-30169 1/1990 Japan .................... 357/74

Primary Examiner—Leo P. Picard
Assistant Examiner—Michael W. Phillips
Attorney, Agent, or Firm—Baker, Maxham, Jester & Meador

[57] ABSTRACT

A single in-line package adapted for surface mounting to a printed circuit board comprises an electronic component, a plurality of leads and a specially configured housing that encloses and protects the electronic component. The outer ends of the leads extend adjacent a tapered lower edge of the housing. The housing further has projections for engaging the upper surface of a printed circuit board to maintain the housing in a stable upright orientation with the outer ends of the leads in physical contact with corresponding solder pads on the printed circuit board during solder re-flow. The tapered edge of the housing is configured to permit subsequent inspection of a plurality of resulting solder joints for acceptable whetting.

8 Claims, 1 Drawing Sheet

U.S. Patent    July 16, 1991    5,032,953

SURFACE MOUNTED SINGLE IN-LINE ELECTRONIC COMPONENT PACKAGE WITH MOUNTING PROJECTIONS AND CHAMFERED VIEWING EDGE

BACKGROUND OF THE INVENTION

The present invention relates to electronic component packaging, and more particularly, to an electronic component package specially adapted for surface mounting techniques.

For many years, electronic circuit boards have been fabricated by interconnecting a plurality of electronic components, both active and passive, on a planar printed circuit board. Typically this printed circuit board has comprised an Epoxy/fiberglass laminate substrate clad with a sheet of copper which as been etched to delineate the conduct paths. Holes were drilled through terminal portions of the conductive paths for receiving electronic component leads which were subsequently soldered thereto.

More recently, so-called surface mount technology has evolved to permit more efficient automatic mass production of circuit boards with higher component densities. With this approach, components are automatically placed at preselected locations on top of a printed circuit board so that their leads are registered with, and lie on top of corresponding solder paths. The printed circuit board is then processed by exposure to infrared or vapor phase soldering techniques to re-flow the solder and thereby establish a permanent electrical connection between the leads and their corresponding conductive paths on the printed circuit board.

Dual in-line chip carrier packages have existed for many years. The most common example is an integrated circuit which is bonded to a ceramic carrier and electrically connected to a lead frame providing opposite rows of parallel electrical leads. The integrated circuit and ceramic carrier are normally encased in a black, rectangular plastic housing from which the leads extend. Typically these dual in-line packages are mounted horizontally, i.e. with the leads extending co-planar with the printed circuit board. Such dual in-line packages have heretofore been attached to printed circuit boards by surface mounting techniques.

It would be desirable to provide a single-in-line package that could be vertically oriented to save space on the printed circuit board. However, due to the relatively high center of gravity, such devices may not be stable after placement upon the printed circuit board. This can lead to the component tipping over, or the leads pulling away from the solder pads, prior to solder re-flow. Any single in-line package intended to be vertically oriented should allow for automatic optical inspection of the final solder joints. Furthermore, in order to facilitate high volume manufacturing, any such package should be configured for ready handling by automated pick and place equipment.

SUMMARY OF THE INVENTION

It is the primary object of the present invention to provide a single in-line package adapted for surface mounting to a printed circuit board.

It is a further object of the present invention to provide an electronic component package which is relatively tall and narrow to facilitate higher density in surface mounting applications, but which will remain stable prior to and during solder re-flow.

It is another object of the present invention to provide an electronic component of the foregoing type which can be readily handled by conventional pick and place equipment.

It is another object of the present invention to provide an electronic component of the foregoing type that will facilitate inspection of the solder joints for acceptable wetting.

It is another object of the present invention to provide an electronic component of the foregoing type whose orientation can be recognized by conventional optical inspection equipment.

The present invention provides a single in-line package adapted for surface mounting to a printed circuit board. The package comprises an electronic component, a plurality of leads and a specially configured housing that encloses and protects the electronic component. The outer ends of the leads extend adjacent a tapered lower edge of the housing. The housing further has projections for engaging the upper surface of a printed circuit board to maintain the housing in a stable upright orientation with the outer ends of the leads in physical contact with corresponding solder pads on the printed circuit board during solder re-flow. The tapered edge of the housing is configured to permit subsequent inspection of a plurality of resulting solder joints for acceptable wetting.

DESCRIPTION OF THE PREFERRED EMBODIMENT

Figure 1:
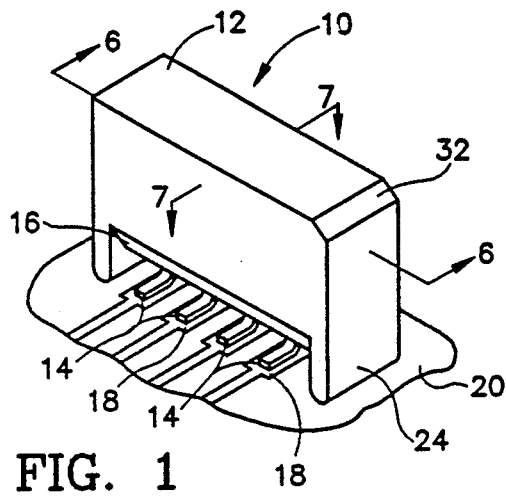
FIG. 1 is a perspective view of a preferred embodiment of a single in-line package constructed in accordance with the present invention mounted to the upper surface of a fragmentary portion of a printed circuit board.
Figure 7:
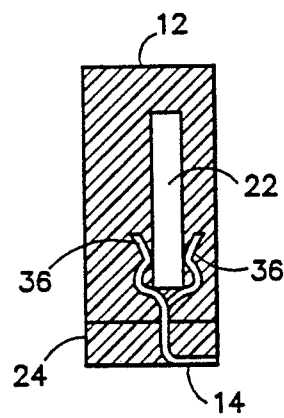
FIG. 7 is an enlarged vertical sectional view of the preferred embodiment taken along line 7—7 of FIG. 1.

Referring to FIG. 1, a preferred embodiment of our single in-line package 10 includes a generally rectangular housing 12 and a plurality of parallel leads, the outer ends 14 of which extend adjacent a tapered lower edge 16 of the housing 12. The outer ends of the leads 14 overlie solder pads 18 formed on top of a printed circuit board 20. The housing 12 encloses an electronic component 22 (FIG. 7). By way of example, this electronic component may comprise a ceramic substrate having a plurality of active and passive electronic devices interconnected on the same to form a circuit. The housing 12 may be molded plastic and may provide a hermetically sealed protective environment for the electronic component 22.

Figure 2:
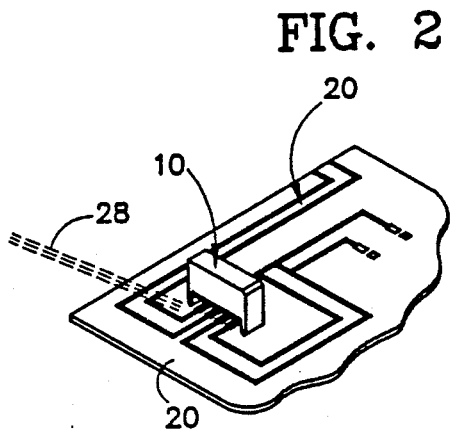
FIG. 2 is a reduced view similar to that of FIG. 1 illustrating the manner in which the preferred embodiment provides a chamfered viewing window to facilitate viewing and inspection of the solder joints.

As best seen in FIG. 2, the preferred embodiment 10 of our single in-line package is designed to be vertically oriented in order to consume a minimum amount of surface area of the printed circuit board 20. For example, the height of the housing 10 may be at least twice the width thereof. This gives the package a relatively high center of gravity.

Referring again to FIG. 1, the housing 12 has pontoons or projections 24 for engaging the upper surface of the printed circuit board to maintain the housing in a stable upright orientation and with the outer lead ends 14 in physical contact with corresponding ones of the solder pads 18 during solder re-flow. The outer lead ends 14 are generally L-shaped in order to accomplish this contact.

Figure 3:
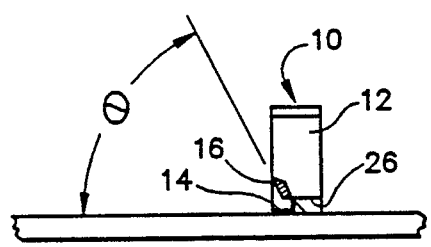
FIG. 3 is a reduced side elevation view of the preferred embodiment further illustrating the chamfered viewing window.

The tapered edge 16 (FIG. 1) of the housing is configured to permit subsequent inspection of a plurality of resulting solder joints for acceptable wetting. This edge terminates before the opposite ends of the housing 12 to thereby define the projections 24. The housing 12 further includes a bottom wall 26 (FIG. 3) which is connected to the tapered lower edge 16 and is vertically spaced from the upper surface of the printed circuit board 20 and the lower ends of the projections 24.

The tapered lower edge 16 (FIG. 1) of the housing 12 provides a chamfered viewing window at its base where egress conductors in the form of outer lead ends 14 are electrically connected to the solder pads 18. This permits a high viewing angle theta as illustrated diagrammatically in FIG. 3. By way of example, theta may equal sixty degrees. The chamfered viewing window represented by the angle theta also permits infrared radiation 28 (FIG. 2) to penetrate the area to start the solder re-flow process.

Figure 4:
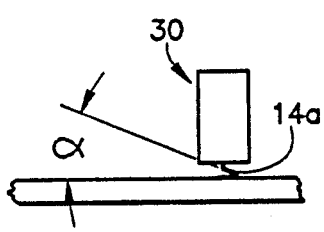
FIGS. 4 and 5 are side elevation views illustrating the reduced viewing window and instability, respectively, of a single in-line package without the chamfered viewing window and lower side edge projections of the preferred embodiment of FIGS. 1-3.

Conventional component packages frequently suffer from a shadowing effect when the egress conductors are tucked in under the mass of the component body. FIG. 4 illustrates a simple rectangular package 30 without the tapered lower edge 16 and projections 24. This arrangement greatly reduces the exposure angle alpha. For example, alpha may measure only twenty-two degrees. The solder joints generally suffer from incomplete re-flow due to shadow over the critical area.

Figure 5:
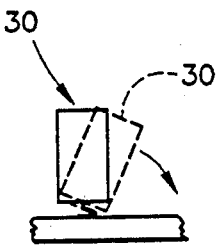

The projections 24 (FIG. 1) insure that the relatively tall package 10 is stable during the solder re-flow process. This results in a significant reduction in open solder connections which might otherwise result from the package's relatively high center of gravity. FIG. 5 illustrates in phantom lines the tipping of the package 30 that results without the projections 24. The package illustrated in FIG. 4 has reverse bent outer lead ends 14a. The pulling away of the lead ends 14a from their corresponding solder pads on the printed circuit board is induced by the tipping motion imparted during assembly line movement of the printed circuit board.

Referring again to FIG. 1, the package 12 further has a keying chamfer on an upper edge of the housing. This keying chamfer is provided in the form of a tapered upper end edge 32. This edge is recognizable by optical recognition cameras which are in widespread use in the electronic industry. This feature does not encumber the necessary surface size required for vacuum tip pickup are of the assembly equipment.

Figure 6:
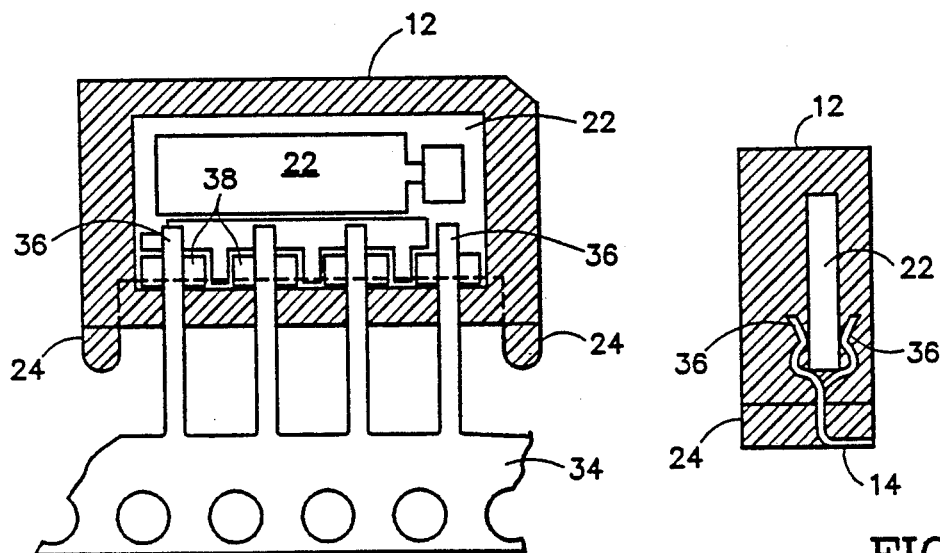
FIG. 6 is an enlarged vertical sectional view of the preferred embodiment taken along line 6—6 of FIG. 1 and further showing a fragmentary portion of a continuous lead frame used in manufacturing the preferred embodiment.

The method of fabrication of the preferred embodiment of our single in-line package may be better understood by way of reference to FIGS. 6 and 7. A continuous lead frame ribbon 34 is first processed so that the split inner ends 36 of the leads are bent in opposite directions as illustrated in FIG. 7. Electronic components such as 22 are then inserted between the split leads establishing electrical contact between the inner lead ends and corresponding electrical contacts 38 of the component. The joined components and lead frame ribbon are passed through an oven so that solder on the contacts 38 re-flows to establish permanent electrical connections. The components are then inserted in book-type molds and plastic is transfer molded around the electronic components and the inner lead ends 36. The outer lead ends 14 are then bent at right angles and severed as illustrated in FIG. 7 so that the lead ends 14 are at the same height or elevation as the lower ends of the projections 24. Thus, when the finished package is vertically placed on top of the printed circuit board, the lead ends 14 will be in physical contact with corresponding solder pads 18 at the same time that the lower ends of the projections 24 are also in contact with the upper surface of the printed circuit board.

Our single in-line package is designed to allow for easy and stable surface mounting on printed circuit boards. Such printed circuit boards are processed by exposure to infrared or vapor phased soldering techniques. The preferred embodiment of our invention is also compatible with the use of robotic pick and place equipment. Prior to our invention, the application of single in-line devices for surface mount applications was impractical for high volume assembly lines. Our invention provides all the necessary features to allow for high volume manufacturing. Our invention allows for higher packaging densities without sacrifice of solder joint inspectability. It also minimizes open solder joints.

While we have described a preferred embodiment of our single in-line package, it should be understood that modifications and adaptations thereof will occur to persons skilled in the art. Therefore, the protection afforded our invention should only be limited in accordance with the scope of the following claims.

We claim:

1. A single in-line package adapted for surface mounting to a printed circuit board, comprising:
    an electronic component having a plurality of electrical contacts;
    a plurality of parallel leads having inner ends and outer ends, the inner ends of the leads being electrically connected to corresponding ones of the electrical contacts of the electronic component; and
    a housing enclosing the electronic component so that the outer ends of the leads extend adjacent a tapered lower edge of the housing, the lower edge terminating before a pair of opposite ends of the housing and defining a pair of projections for engaging the upper surface of a printed circuit board to maintain the housing in a stable upright orientation with the outer ends of the leads in physical contact with corresponding solder pads on the printed circuit board during solder re-flow, whereby the tapered edge permits subsequent inspection of a plurality of resulting solder joints for acceptable wetting.

2. A single in-line package according to claim 1 wherein the housing further has a keying chamfer on an upper edge of the housing.

3. A single in-line package according to claim 1 wherein the electronic component includes a ceramic substrate and a plurality of electronic devices interconnected on the same.

4. A single in-line package according to claim 1 wherein the tapered lower edge of the housing is angled approximately sixty degrees relative to the upper surface of a printed circuit board.

5. A single in-line package according to claim 1 wherein the housing is made of a molded plastic.

6. A single in-line package according to claim 1 wherein the outer ends of the leads are L-shaped.

7. A single in-line package according to claim 1 wherein a height of the housing is at least twice a width thereof.

8. A single in-line package according to claim 1 wherein the housing further includes a bottom wall connected to the tapered lower edge and spaced from a lower end of each of the projections.

* * * * *